(12) United States Patent
Odaka

(10) Patent No.: US 11,508,944 B2
(45) Date of Patent: Nov. 22, 2022

(54) DISPLAY DEVICE

(71) Applicant: Japan Display Inc., Tokyo (JP)

(72) Inventor: Kazuhiro Odaka, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 68 days.

(21) Appl. No.: 16/874,698

(22) Filed: May 15, 2020

(65) Prior Publication Data

US 2020/0280015 A1    Sep. 3, 2020

Related U.S. Application Data

(63) Continuation of application No. PCT/JP2018/030946, filed on Aug. 22, 2018.

(30) Foreign Application Priority Data

Nov. 20, 2017  (JP) .............................. JP2017-222723

(51) Int. Cl.
   *H01L 51/52*     (2006.01)
   *G06V 40/13*     (2022.01)

(52) U.S. Cl.
   CPC ........ *H01L 51/529* (2013.01); *G06V 40/1318* (2022.01); *H01L 51/5284* (2013.01)

(58) Field of Classification Search
   CPC . H01L 51/529; H01L 51/5284; H01L 27/323; H01L 27/3234; H01L 23/12;

(Continued)

(56) References Cited

U.S. PATENT DOCUMENTS

2005/0285519 A1* 12/2005 Cok ...................... H01L 51/529
                                                    313/512
2009/0231297 A1*  9/2009 Hatakeyama ........... G06F 3/046
                                                    345/173

(Continued)

FOREIGN PATENT DOCUMENTS

CN        206162451 U     5/2017
CN        107305411 A    10/2017

(Continued)

OTHER PUBLICATIONS

International Search Report and Written Opinion dated Oct. 23, 2018 for PCT/JP2018/030946 filed on Aug. 22, 2018, 11 pages including English Translation of the International Search Report.

(Continued)

*Primary Examiner* — S M Sohel Imtiaz
(74) *Attorney, Agent, or Firm* — Xsensus LLP

(57) ABSTRACT

A display device includes a display circuit layer including a first surface and a second surface and including a display area in which an image is displayed on the first surface, a heat conductive sheet overlapping the display circuit layer below the second surface, and an optical fingerprint sensor inside the display area below the heat conductive sheet and overlapping the display circuit layer. The heat conductive sheet includes a first area overlapping the optical fingerprint sensor and a second area overlapping the display area around the optical fingerprint sensor. The heat conductive sheet includes a heat conductive material, has a shape having a light transmittance required for sensing by the optical fingerprint sensor in the first area, and has no light transmittance in the second area.

14 Claims, 18 Drawing Sheets

(58) Field of Classification Search
CPC ......... H01L 31/12; G06K 9/0004; G09F 9/00;
G09F 9/30; H05B 33/02; H05B 33/14;
H05B 33/22; G06V 40/1318
See application file for complete search history.

(56) References Cited

U.S. PATENT DOCUMENTS

| | | | |
|---|---|---|---|
| 2016/0029511 A1* | 1/2016 | Jung | H01L 23/42 |
| | | | 361/700 |
| 2017/0124372 A1* | 5/2017 | Evans, V | G06F 1/1684 |
| 2017/0179211 A1* | 6/2017 | Kanaya | H01L 27/3258 |
| 2017/0213065 A1* | 7/2017 | Kurasawa | G06K 9/0002 |
| 2017/0300736 A1* | 10/2017 | Song | G06K 9/0004 |
| 2018/0121703 A1* | 5/2018 | Jung | G06K 9/00046 |
| 2018/0150671 A1* | 5/2018 | Choo | G09G 3/3233 |
| 2018/0249586 A1* | 8/2018 | Kim | B29C 43/52 |
| 2019/0171859 A1* | 6/2019 | Kurasawa | G06K 9/0002 |
| 2019/0196641 A1* | 6/2019 | Ryu | G06F 3/0443 |
| 2019/0303640 A1 | 10/2019 | Song et al. | |
| 2021/0042495 A1* | 2/2021 | Song | G06K 9/00033 |

FOREIGN PATENT DOCUMENTS

| | | |
|---|---|---|
| JP | 2017-117594 A | 6/2017 |
| JP | 2017-134828 A | 8/2017 |

OTHER PUBLICATIONS

Chinese Office Action dated Jun. 30, 2021, in corresponding Chinese Patent Application No. 201880074617.4.

* cited by examiner

DISPLAY DEVICE

CROSS-REFERENCE TO RELATED APPLICATION

This application is a continuation application of International Application PCT/JP2018/030946 filed on Aug. 22, 2018, which claims priority from Japanese patent application JP2017-222723 filed on Nov. 20, 2017. The contents of these applications are incorporated herein by reference in their entirety.

BACKGROUND

1. Field

The present invention relates to a display device.

2. Description of the Related Art

A display device using a light emitting element such as an organic light emitting diode (OLED) has been put to practical use (JP 2017-117594 A). Such a display device has better visibility and response speed than a liquid crystal display device. A display device equipped with a fingerprint sensor is also known (JP 2017-134828 A).

Since a display device using a light emitting element does not use a backlight, the light emitting element is locally turned on in order to display an image having a bright portion locally on a dark background. Since the light emitting element generates heat by lighting, a temperature difference occurs between alighted portion and a non-lighted portion. In order to prevent local deterioration of the light emitting element due to heat, a heat equalizing sheet is provided, but the heat equalizing sheet has low light transmittance. Therefore, the optical fingerprint sensor cannot be arranged below the heat equalizing sheet in the display area. Alternatively, when an opening corresponding to the optical fingerprint sensor is formed in the heat equalizing sheet, the heat cannot be equalized in the opening.

SUMMARY

An object of the present invention is to arrange an optical fingerprint sensor in a display area while achieving heat equalization.

A display device according to the present invention includes a display circuit layer including a first surface and a second surface and including a display area in which an image is displayed on the first surface, a heat conductive sheet overlapping the display circuit layer below the second surface, and an optical fingerprint sensor inside the display area below the heat conductive sheet and overlapping the display circuit layer, in which the heat conductive sheet includes a first area overlapping the optical fingerprint sensor and a second area overlapping the display area around the optical fingerprint sensor, and the heat conductive sheet is made of a heat conductive material in a shape having light transmittance required for sensing by the optical fingerprint sensor, in the first area, and the heat conductive sheet includes a heat conductive layer made of the heat conductive material and has no light transmittance, in the second area.

According to the present invention, since the heat conductive sheet includes a portion made of a heat conductive material also in the first area overlapping the optical fingerprint sensor, it is possible to achieve heat equalization. Since the first area has light transmittance, the sensing by the optical fingerprint sensor can be performed in the display area.

DETAILED DESCRIPTION

Figure 1:
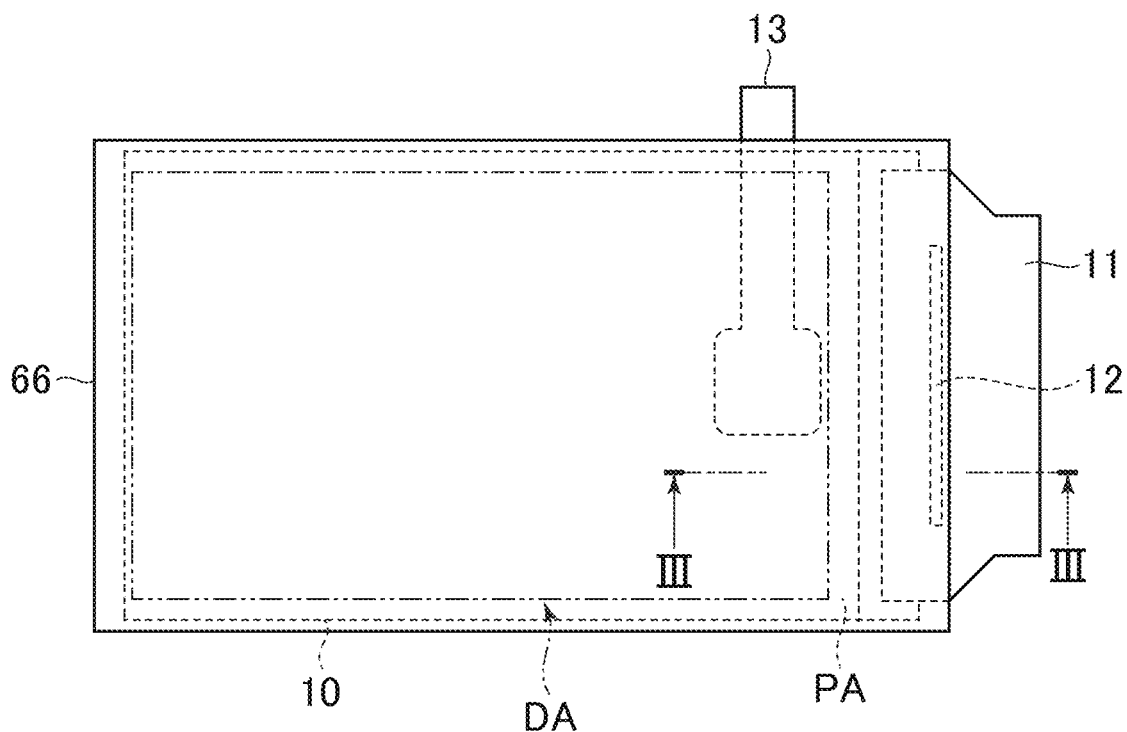
FIG. 1 is a plan view of a display device according to a first embodiment of the present invention.

Hereinafter, embodiments of the present invention will be described with reference to the drawings. However, the present invention can be carried out in various modes without departing from the gist of the present invention, and is not to be construed as being limited to the description of the embodiments exemplified below.

The drawings may be schematically illustrated in terms of width, thickness, shape, and the like of each portion as compared with actual embodiments in order to make the description clearer, but are merely examples, and are not intended to limit the interpretation of the present invention. In the specification and the drawings, elements having the same functions as those described in relation to the already described drawings are denoted by the same reference numerals, and the redundant description may be omitted.

Furthermore, in the detailed description of the present invention, when defining the positional relationship between a certain component and another component, the terms "above" and "below" include not only the case where located directly above or below the certain component, but also the case where other components are further interposed therebetween unless otherwise specified.

First Embodiment

Figure 2:
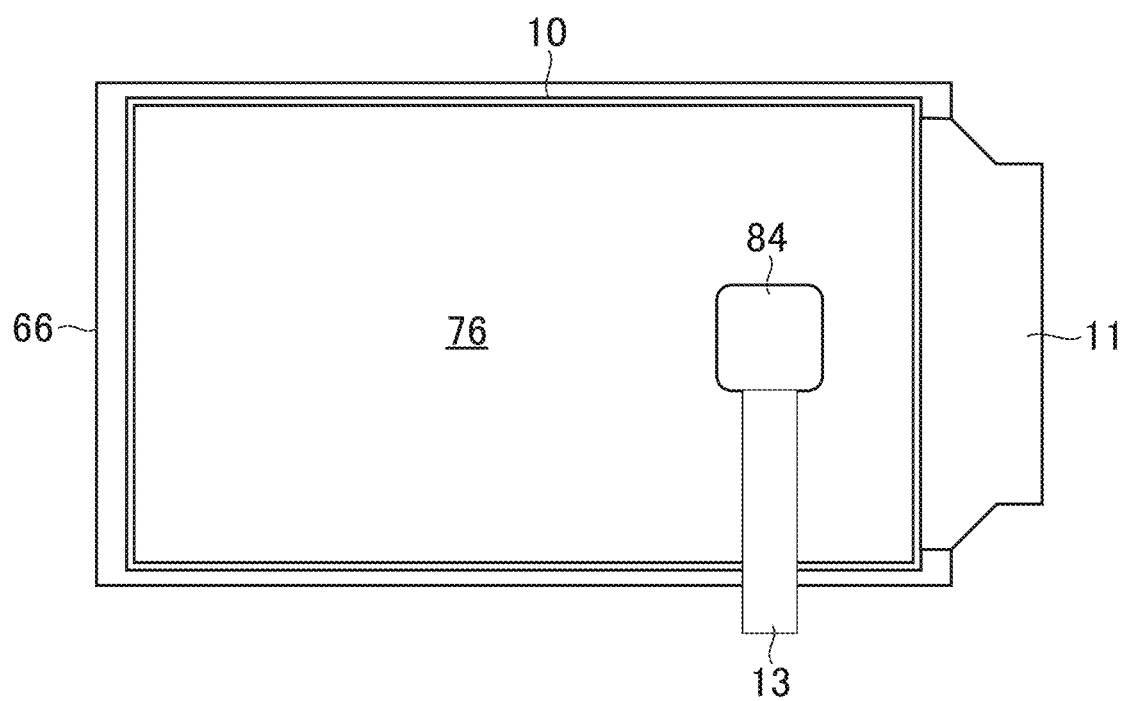
FIG. 2 is a rear view of the display device shown in FIG. 1.

FIG. 1 is a plan view of a display device according to a first embodiment of the present invention. FIG. 2 is a rear view of the display device shown in FIG. 1.

The display device is an organic Electroluminescence (EL) display device. The display device is configured to form a full-color pixel by combining unit pixels (sub-pixels) of a plurality of colors including red, green, and blue, and display a full-color image. The display device includes a display area DA and a peripheral area PA surrounding the display area DA. The peripheral area PA is outside the display area DA. A flexible printed circuit board 11 is connected to the peripheral area PA. An integrated circuit 12 for driving an element for displaying an image is mounted on the flexible printed circuit board 11.

Figure 3:
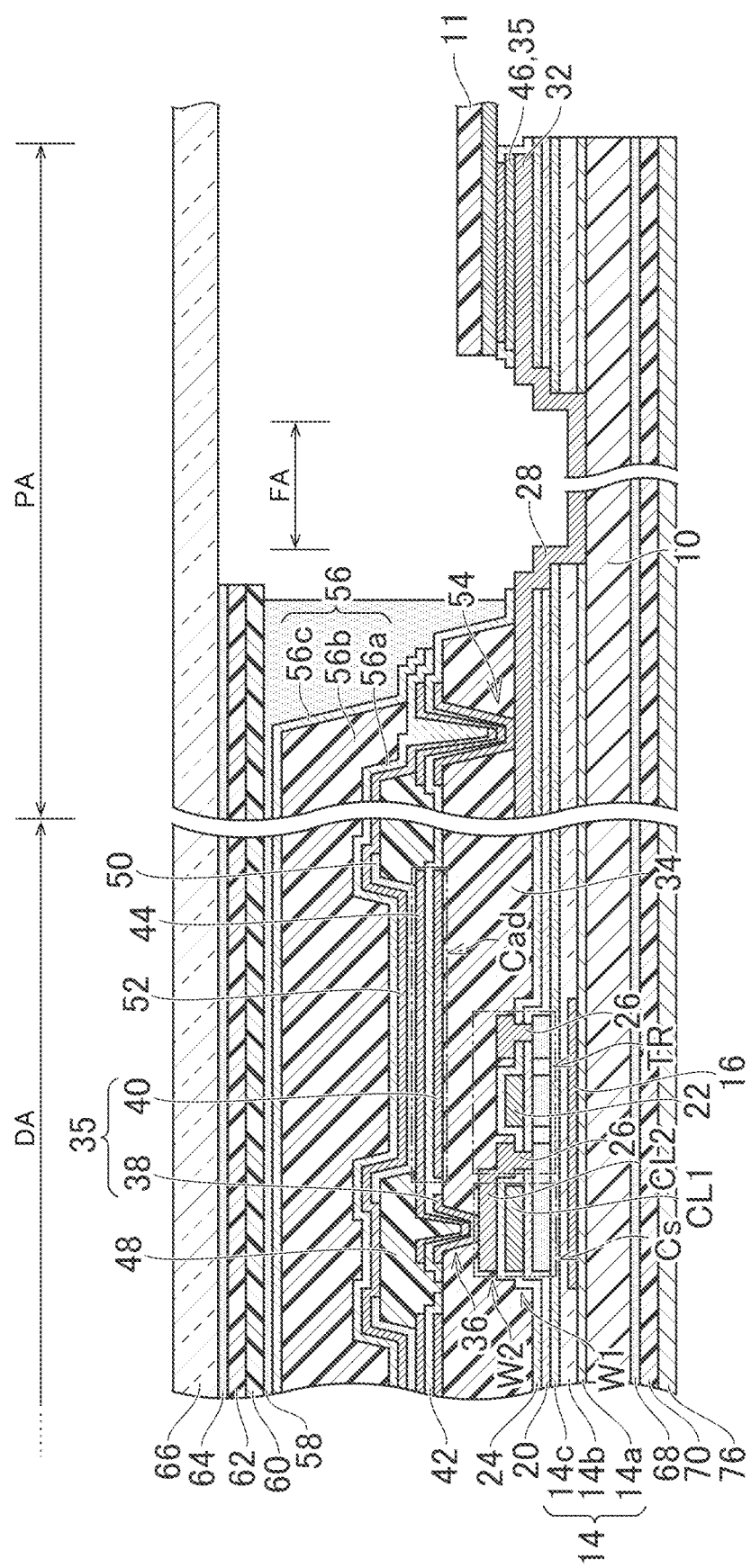
FIG. 3 is a cross-sectional view taken along line III-III of the display device shown in FIG. 1.

FIG. 3 is a cross-sectional view taken along line III-III of the display device shown in FIG. 1. As a substrate 10 (array substrate), polyimide is used. However, another resin material may be used as long as the material has sufficient flexibility to constitute a sheet display or a flexible display.

On the substrate 10, a three-layer stacked structure of a silicon oxide film 14a, a silicon nitride film 14b, and a silicon oxide film 14c is provided as an undercoat layer 14. The lowermost silicon oxide film 14a is provided for improving the adhesion to the substrate 10, the intermediate silicon nitride film 14b is provided as a block film against moisture and impurities from the outside, and the uppermost silicon oxide film 14c is provided as a block film for preventing hydrogen atoms contained in the silicon nitride film 14b from diffusing to a semiconductor layer 18 side of a thin film transistor TR. However, the structure is not particularly limited to this structure, and may be further stacked, or may be a single layer or a two-layer stack.

Under the undercoat layer 14, an additional film 16 may be formed at a position where the thin film transistor TR is formed. The additional film 16 can suppress a change in the characteristics of the thin film transistor TR due to the intrusion of light from the back surface of the channel, or can give a back gate effect to the thin film transistor TR by being formed of a conductive material and giving a predetermined potential. Here, after forming the silicon oxide film 14a, the additional film 16 is formed in an island shape in accordance with the position where the thin film transistor TR is to be formed, and then the silicon nitride film 14b and the silicon oxide film 14c are stacked, and thus, the additional film 16 is formed to be sealed in the undercoat layer 14. The present invention is not limited thereto. The additional film 16 may be first formed on the substrate 10, and then the undercoat layer 14 may be formed.

The thin film transistor TR is formed on the undercoat layer 14. Only an Nch transistor is illustrated here by taking a polysilicon thin film transistor as an example, but a Pch transistor may be formed at the same time. The semiconductor layer 18 of the thin film transistor TR has a structure in which a low-concentration impurity region is provided between a channel region and a source and drain region. Here, a silicon oxide film is used as a gate insulating film 20. A gate electrode 22 is a part of a first wiring layer W1 formed of MoW. The first wiring layer W1 includes a first storage capacitance line CL1 in addition to the gate electrode 22. Apart of a storage capacitor Cs is formed between the first storage capacitance line CL1 and the semiconductor layer 18 (source and drain region) via the gate insulating film 20.

On the gate electrode 22, an interlayer insulating film 24 (silicon oxide film and silicon nitride film) is stacked. When allowing the substrate 10 to be bent, at least a part of the interlayer insulating film 24 is removed in a bending area FA to be easily bent. Since the undercoat layer 14 is exposed by removing the interlayer insulating film 24, at least apart thereof is also removed by patterning. After removing the undercoat layer 14, the polyimide constituting the substrate 10 is exposed. In some cases, the polyimide surface may be partially eroded through etching of the undercoat layer 14 to reduce the film thickness.

On the interlayer insulating film 24, a second wiring layer W2 including a portion serving as a source and drain electrode 26 and a routing wiring 28 is formed. Here, a three-layer stacked structure of Ti, Al, and Ti is employed. The first storage capacitance line CL1 (part of the first wiring layer W1) and a second storage capacitance line CL2 (part of the second wiring layer W2) form a part of another storage capacitor Cs via the interlayer insulating film 24. The routing wiring 28 extends to an end of the substrate 10 to include a terminal 32 for connecting the flexible printed circuit board 11.

A planarizing film 34 is provided to cover the source and drain electrode 26 and the routing wiring 28 (except for a part thereof). As the planarizing film 34, an organic material such as photosensitive acrylic is often used because the organic material has better surface planarization than an inorganic insulating material formed by chemical vapor deposition (CVD) or the like.

The planarizing film 34 is removed at a pixel contact portion 36 and the peripheral area PA, and an indium tin oxide film 35 is formed thereon. The indium tin oxide film 35 includes a first transparent conductive film 38 and a second transparent conductive film 40 separated from each other.

The second wiring layer W2 whose surface is exposed by removing the planarizing film 34 is covered with the first transparent conductive film 38. A silicon nitride film 42 is provided on the planarizing film 34 to cover the first transparent conductive film 38. The silicon nitride film 42 has an opening in the pixel contact portion 36, and a pixel electrode 44 is stacked so as to be conducted to the source and drain electrode 26 through the opening. The pixel electrode 44 is formed as a reflective electrode and has a three-layer stacked structure of an indium zinc oxide (IZO) film, an Ag film, and an IZO film. Here, the indium tin oxide film 35 may be used instead of the IZO film. The pixel electrode 44 extends laterally from the pixel contact portion 36 and reaches above the thin film transistor TR.

The second transparent conductive film 40 is provided adjacent to the pixel contact portion 36, below the pixel electrodes 44 (further below the silicon nitride film 42). The second transparent conductive film 40, the silicon nitride film 42, and the pixel electrode 44 are overlapped to form an additional capacitor Cad.

On the surface of the terminal 32, a third transparent conductive film 46 which is another part of the indium tin oxide film 35 is formed. The third transparent conductive film 46 is formed simultaneously with the first transparent conductive film 38 and the second transparent conductive film 40. The third transparent conductive film 46 on the terminal 32 is provided as a barrier film so that an exposed portion of the terminal 32 is not damaged in a subsequent process. At the time of patterning the pixel electrode 44, the third transparent conductive film 46 is exposed to an etching environment. However, the indium tin oxide film 35 has sufficient resistance to the etching of the pixel electrode 44 by an annealing process performed between the formation of the indium tin oxide film 35 and the formation of the pixel electrode 44.

On the planarizing film 34, for example, above the pixel contact portion 36, an insulating layer 48 which is called a bank (rib) and serves as a partition between adjacent pixel regions is formed. As the insulating layer 48, photosensitive acrylic or the like is used similarly to the planarizing film 34. The insulating layer 48 is opened to expose the surface of the pixel electrode 44 as a light emitting region, and the opening end preferably has a gentle taper shape. If the opening end has a steep shape, poor coverage of an organic electro luminescence (EL) layer 50 formed thereon will occur.

The planarizing film 34 and the insulating layer 48 are in contact through an opening provided in the silicon nitride film 42 therebetween. Thus, moisture and gas desorbed and degassed from the planarizing film 34 can be extracted through the insulating layer 48 by heat treatment or the like after the formation of the insulating layer 48.

The organic EL layer 50 made of an organic material is stacked on the pixel electrode 44. The organic EL layer 50 may be a single layer, or may have a structure in which a hole transport layer, a light emitting layer, and an electron transport layer are sequentially stacked from the pixel electrode 44 side. These layers may be formed by vapor deposition, may be formed by coating over a solvent dispersion, or may be formed selectively with respect to the pixel electrode 44 (each sub-pixel). Alternatively, these layers may be formed by solid formation on the entire surface covering the display area DA. In the case of solid formation, white light can be obtained in all sub-pixels, and a desired color wavelength portion can be extracted by a color filter (not illustrated).

A counter electrode 52 is provided on the organic EL layer 50. Here, the counter electrode 52 is transparent due to the top emission structure. For example, the Mg layer and the Ag layer are formed as films thin to an extent that transmits light emitted from the organic EL layer 50. According to the above-described order of forming the organic EL layer 50, the pixel electrode 44 serves as an anode and the counter electrode 52 serves as a cathode. The counter electrode 52 is formed over the display area DA and over a cathode contact portion 54 provided near the display area DA. The counter electrode 52 is connected to the lower routing wiring 28 at the cathode contact portion 54 and electrically connected to the terminal 32.

A sealing film 56 is formed on the counter electrode 52. One function of the sealing film 56 is to prevent the previously formed organic EL layer 50 from the intrusion of moisture from the outside, and a high gas barrier property is required. Here, the stacked structure including the silicon nitride film is a stacked structure of a silicon nitride film 56a, an organic resin layer 56b, and a silicon nitride film 56c. A silicon oxide film or an amorphous silicon layer may be provided between the silicon nitride films 56a and 56c and the organic resin layer 56b for the purpose of improving adhesion.

A touch panel substrate 60 is stacked on the sealing film 56 via an adhesive layer 58. At least a part of a touch sensing electrode (not shown) is formed on the touch panel substrate 60. Apart of the touch sensing electrode may be shared by the counter electrode 52. A circularly polarizing plate 62 is attached to the touch panel substrate 60. A cover glass 66 is stacked on the circularly polarizing plate 62 via an adhesive layer 64. On the other hand, a support film 70 is stacked on the substrate 10 via an adhesive layer 68.

Figure 4:
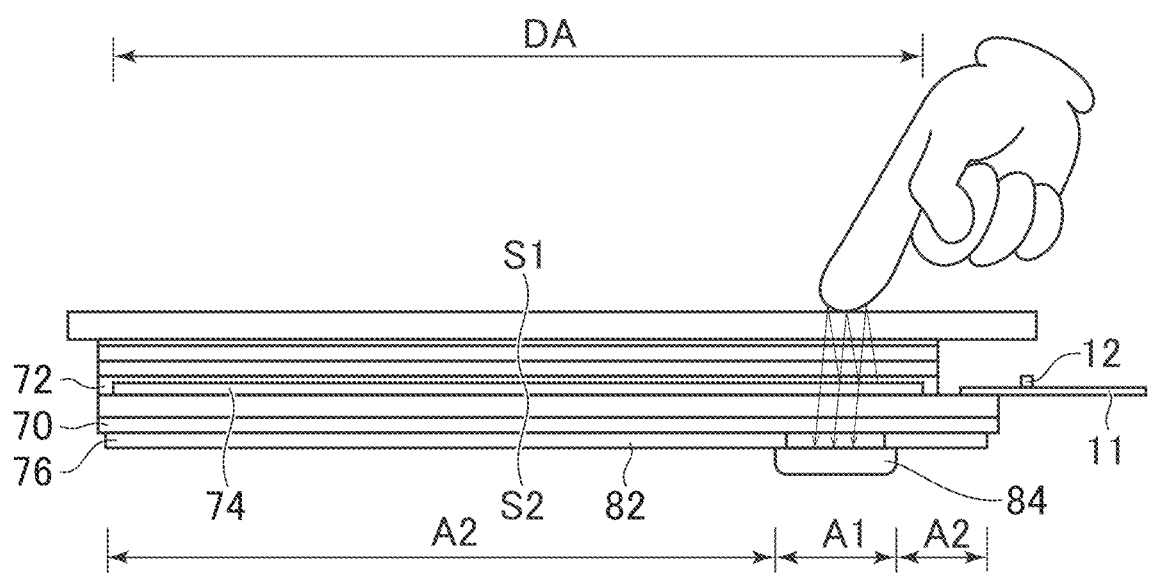
FIG. 4 is a diagram for illustrating the outline and operation of the display device shown in FIG. 3.

FIG. 4 is a diagram for illustrating the outline and operation of the display device shown in FIG. 3. The display device includes a display circuit layer 72. The display circuit layer 72 includes, for example, layers from the undercoat layer 14 to the sealing film 56 in FIG. 3. The display circuit layer 72 includes a plurality of light emitting elements 74 for displaying an image in the display area DA. The light emitting element 74 includes the pixel electrode 44, the organic EL layer 50, and the counter electrode 52 shown in FIG. 3. Further, the display circuit layer 72 includes the thin film transistor TR shown in FIG. 3. The display circuit layer 72 includes a first surface S1 and a second surface S2. An image is displayed in the display area DA on the first surface S1.

A heat conductive sheet 76 overlaps the display circuit layer 72 below the second surface S2. The heat conductive sheet 76 is attached to the support film 70. The heat conductive sheet 76 is made of a heat conductive material containing at least one element selected from the group consisting of copper, chromium, and carbon. The heat conductive sheet 76 has a thermal diffusion property and can diffuse heat even when light is emitted only in a part of the display area DA.

Figure 5:
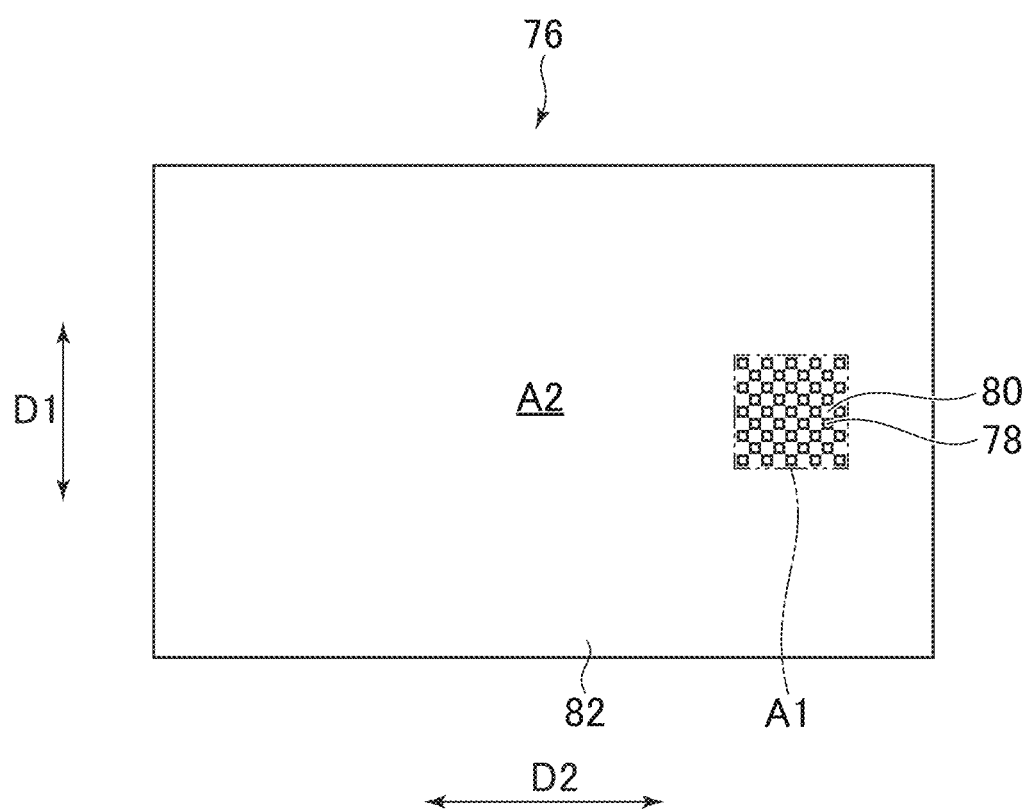
FIG. 5 is a diagram illustrating details of a heat conductive sheet.

FIG. 5 is a diagram illustrating details of the heat conductive sheet 76. The heat conductive sheet 76 includes a plurality of light transmitting portions 78 in a first area A1. The plurality of light transmitting portions 78 are formed of slits or holes and have light transmittance. The heat conductive sheet 76 includes a plurality of heat conducting portions 80 in the first area A1. The plurality of heat conducting portions 80 are made of a heat conductive material and have no light transmittance. The plurality of light transmitting portions 78 and the plurality of heat conducting portions 80 are alternately provided in at least one direction (for example, both the first direction D1 and the second direction D2 orthogonal to each other). The heat conductive sheet 76 includes a heat conductive layer 82 made of a heat conductive material in the second area A2, and has no light transmittance. The plurality of heat conducting portions 80 are integrated with each other continuously from the second area A2. The first area A1 and the second area A2 overlap the display area DA.

As shown in FIG. 4, an optical fingerprint sensor 84 is attached to the heat conductive sheet 76. The optical fingerprint sensor 84 is directly mounted on the heat conductive sheet 76. A flexible printed circuit board 13 is connected to the optical fingerprint sensor 84 as shown in FIGS. 1 and 2. The optical fingerprint sensor 84 overlaps the display circuit layer 72 below the heat conductive sheet 76 and inside the display area DA. The sensing by the optical fingerprint sensor 84 uses light from the plurality of light emitting elements 74. More specifically, light from the organic EL layer 50 (FIG. 3) in a region facing the optical fingerprint sensor 84 is reflected by a finger and enters the optical fingerprint sensor 84. Since the organic EL layer 50 emits light locally, heat is locally generated, but the heat conductive sheet 76 can achieve heat equalization.

The optical fingerprint sensor 84 overlaps the first area A1 of the heat conductive sheet 76. The heat conductive sheet 76 has a shape having light transmittance required for sensing by the optical fingerprint sensor 84 in the first area A1. For this reason, light can pass through the heat conductive sheet 76 for sensing. The first area A1 fits within the outer shape of the optical fingerprint sensor 84, and the optical fingerprint sensor 84 covers the entire first area A1.

Therefore, external light is prevented from entering the optical fingerprint sensor 84. The second area A2 having no light transmittance overlaps the display area DA around the optical fingerprint sensor 84.

According to the present embodiment, since the heat conductive sheet 76 includes a portion made of a heat conductive material also in the first area A1 overlapping the optical fingerprint sensor 84, the heat equalization can be achieved. Since the first area A1 has the light transmittance, the sensing by the optical fingerprint sensor 84 is possible in the display area DA.

Figure 6:
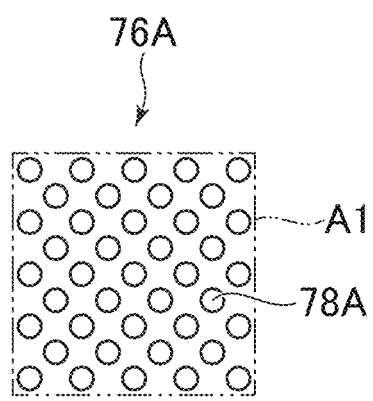
FIG. 6 is a diagram illustrating a first modification of the heat conductive sheet according to the first embodiment.

FIG. 6 is a diagram illustrating a first modification of the heat conductive sheet according to the first embodiment. In the example shown in FIG. 5, the plurality of light transmitting portions 78 of the heat conductive sheet 76 in the first area A1 are rectangular holes, respectively. However, in the example shown in FIG. 6, a heat conductive sheet 76A includes a plurality of light transmitting portions 78A each formed of a circular hole in the first area A1.

Figure 7:
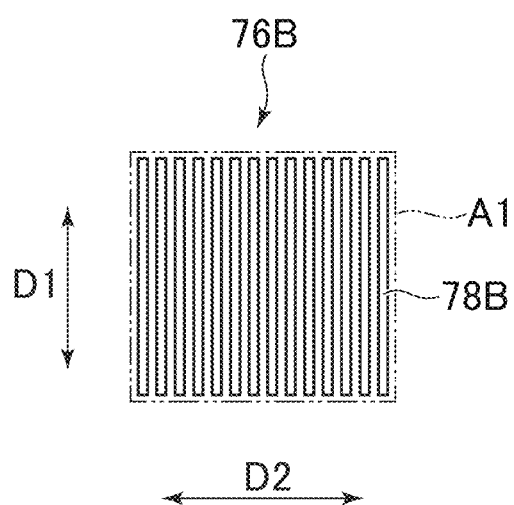
FIG. 7 is a diagram illustrating a second modification of the heat conductive sheet according to the first embodiment.

FIG. 7 is a diagram illustrating a second modification of the heat conductive sheet according to the first embodiment. In this example, a heat conductive sheet 76B includes, in the first area A1, a plurality of light transmitting portions 78B each formed of a slit elongated in the first direction D1. The plurality of light transmitting portions 78B are arranged in the second direction D2 orthogonal to the first direction D1.

Figure 8:
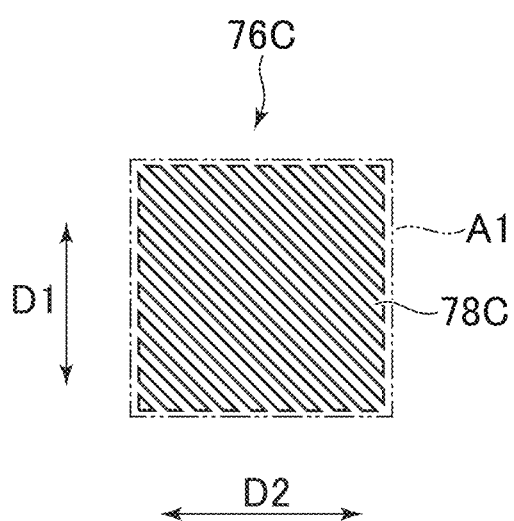
FIG. 8 is a diagram illustrating a third modification of the heat conductive sheet according to the first embodiment.

FIG. 8 is a diagram illustrating a third modification of the heat conductive sheet according to the first embodiment. In this example, the first area A1 of a heat conductive sheet 76C is a rectangle whose sides extend in the first direction D1 and the second direction D2. A plurality of light transmitting portions 78C are each formed of a slit extending obliquely in both the first direction D1 and the second direction D2.

Figure 9:
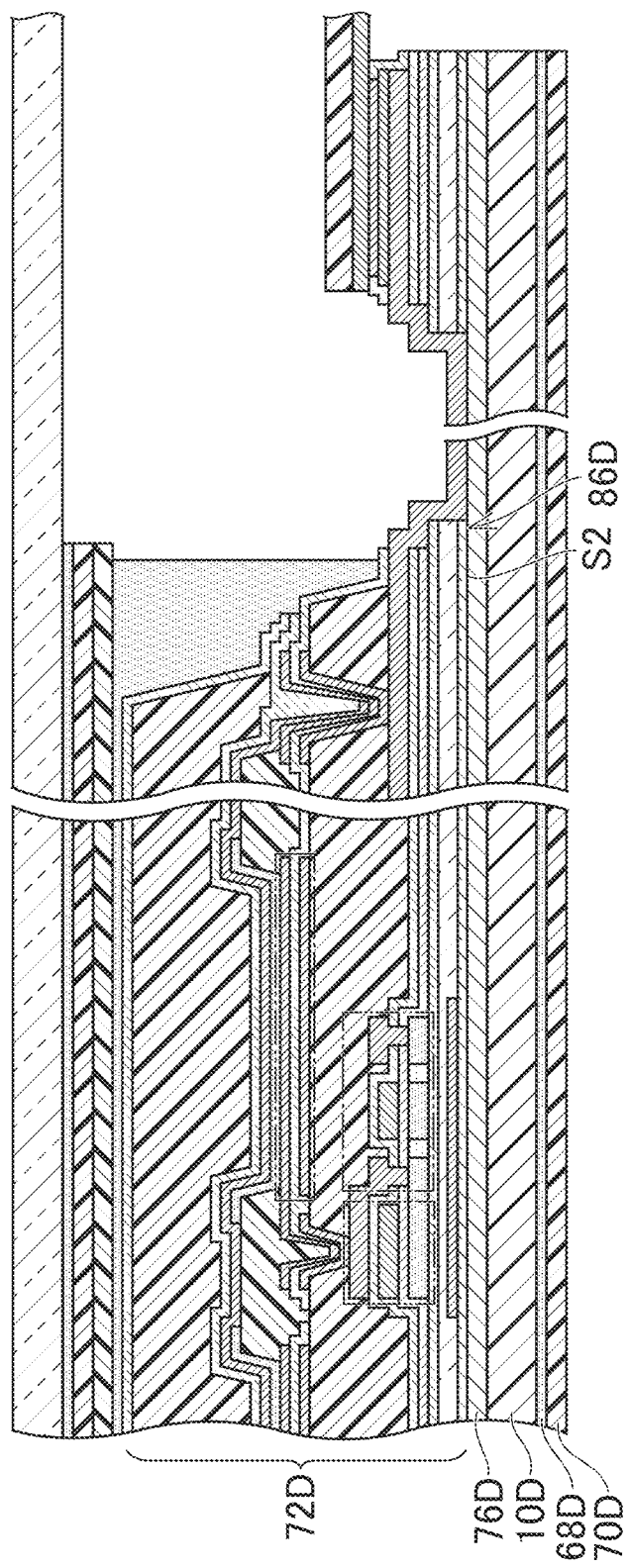
FIG. 9 is a diagram illustrating a fourth modification of the display device according to the first embodiment.

FIG. 9 is a diagram illustrating a fourth modification of the display device according to the first embodiment. In this example, the second surface S2 of a display circuit layer 72D is made of an inorganic insulating film 86D. The inorganic insulating film 86D includes, for example, the silicon oxide film 14a and the routing wiring 28 shown in FIG. 3. A heat conductive sheet 76D is directly stacked on the inorganic insulating film 86D. Under the heat conductive sheet 76D, a substrate 10D, an adhesive layer 68D, and a support film 70D are stacked.

Figure 10:
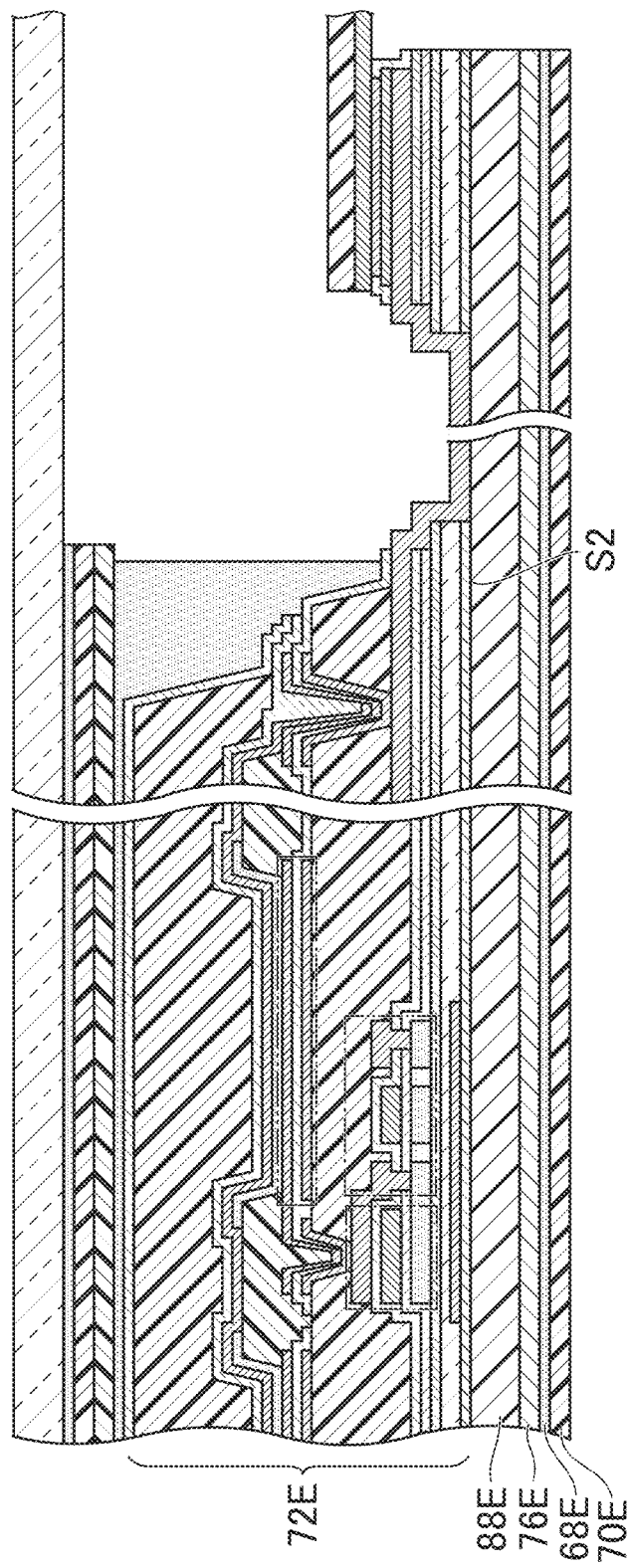
FIG. 10 is a diagram illustrating a fifth modification of the display device according to the first embodiment.

FIG. 10 is a diagram illustrating a fifth modification of the display device according to the first embodiment. In this example, an organic insulating film 88E is stacked below the second surface S2 of a display circuit layer 72E. The organic insulating film 88E may be the substrate 10 of FIG. 3. A heat conductive sheet 76E is below the organic insulating film 88E. Under the heat conductive sheet 76E, an adhesive layer 68E and a support film 70E are stacked.

Figure 11:
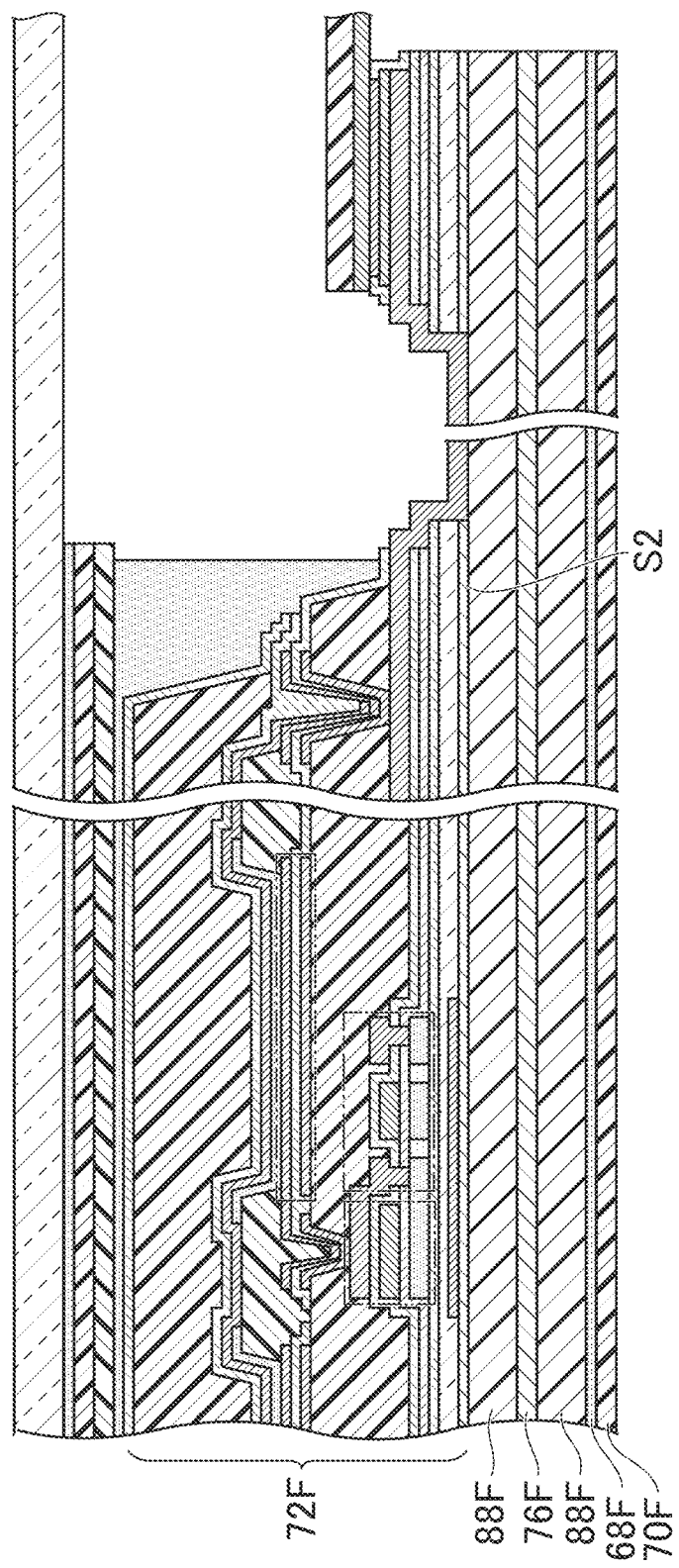
FIG. 11 is a diagram illustrating a sixth modification of the display device according to the first embodiment.

FIG. 11 is a diagram illustrating a sixth modification of the display device according to the first embodiment. In this example, a pair of organic insulating films 88F are stacked below the second surface S2 of a display circuit layer 72F. A heat conductive sheet 76F is interposed between the pair of organic insulating films 88F. Under the pair of organic insulating films 88F, an adhesive layer 68F and a support film 70F are stacked.

Figure 12:
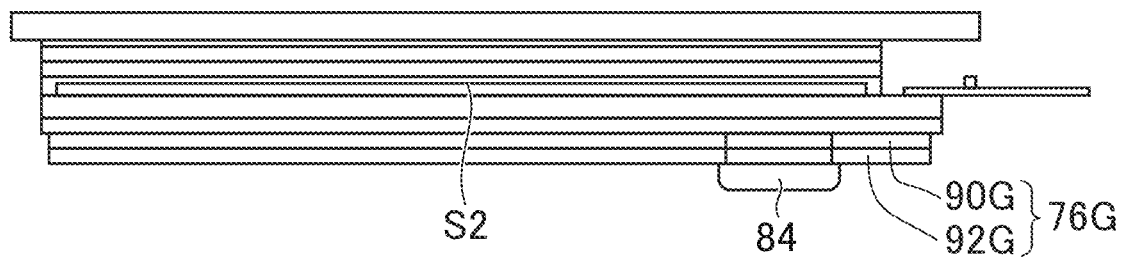
FIG. 12 is a diagram illustrating a seventh modification of the display device according to the first embodiment.

FIG. 12 is a diagram illustrating a seventh modification of the display device according to the first embodiment. In this example, a heat conductive sheet 76G includes a plurality of layers and includes an uppermost layer 90G closest to the second surface S2, and a base layer 92G below the uppermost layer 90G. The uppermost layer 90G has a lower light reflectance than the base layer 92G.

Second Embodiment

Figure 13:
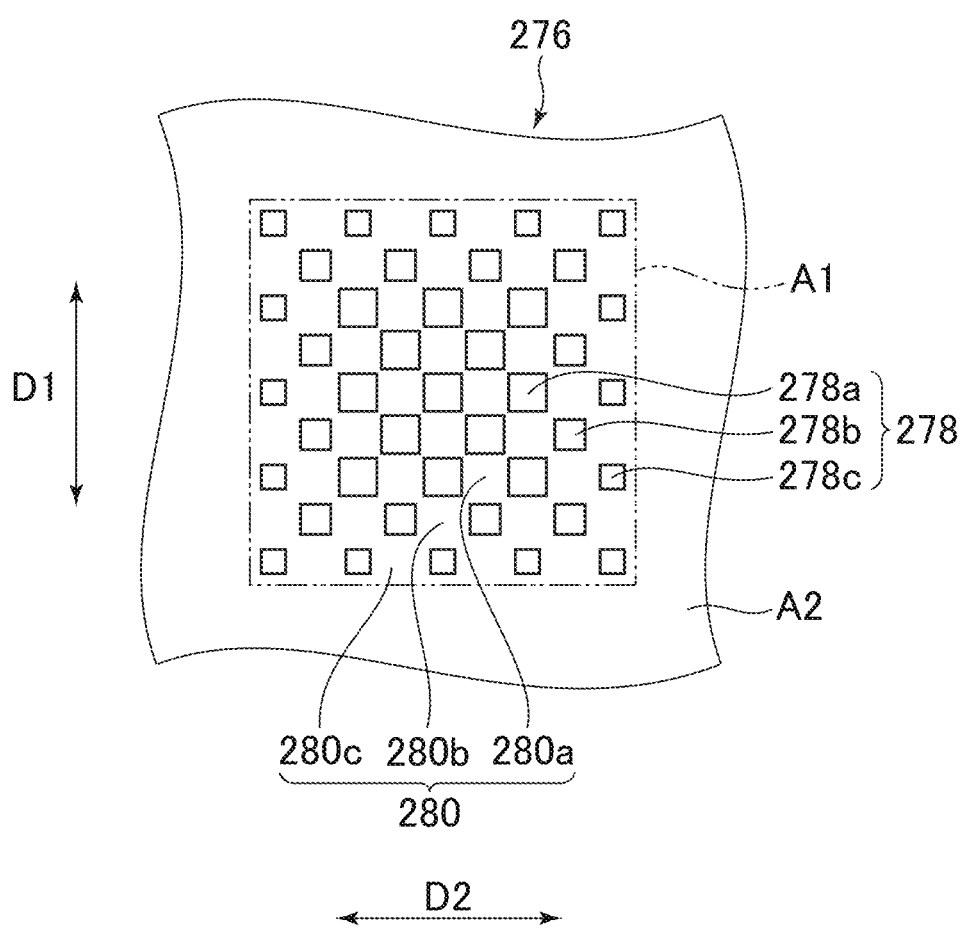
FIG. 13 is a diagram illustrating a heat conductive sheet according to a second embodiment to which the present invention is applied.

FIG. 13 is a diagram illustrating a heat conductive sheet according to a second embodiment to which the present invention is applied. In the present embodiment, a heat conductive sheet 276 includes a plurality of light transmitting portions 278 (278a, 278b, and 278c) having different sizes (areas) in the first area A1. The heat conductive sheet 276 includes a plurality of heat conducting portions 280 (280a, 280b, and 280c) having different sizes (areas) in the first area A1. The plurality of light transmitting portions 278 and the plurality of heat conducting portions 280 are alternately arranged in the first direction D1 and the second directions D2 orthogonal to each other.

Along at least one of the first direction D1 and the second direction D2 (both in this example), the ratio of the plurality of light transmitting portions 278 occupying the first area A1 changes. For example, the ratio of the plurality of light transmitting portions 278 occupying the first area A1 is smaller as the position is closer to the second area A2. That is, the ratio of the plurality of heat conducting portions 280 occupying the first area A1 increases as the position is closer to the second area A2.

According to the present embodiment, the amount of transmitted light of the first area A1 through which light passes is gradually reduced as the position thereof is closer to the second area through which light does not pass. For this reason, the change in the amount of transmitted light near the boundary between the first area A1 and the second area A2 becomes mild and thus, the boundary becomes difficult to be recognized.

Figure 14:
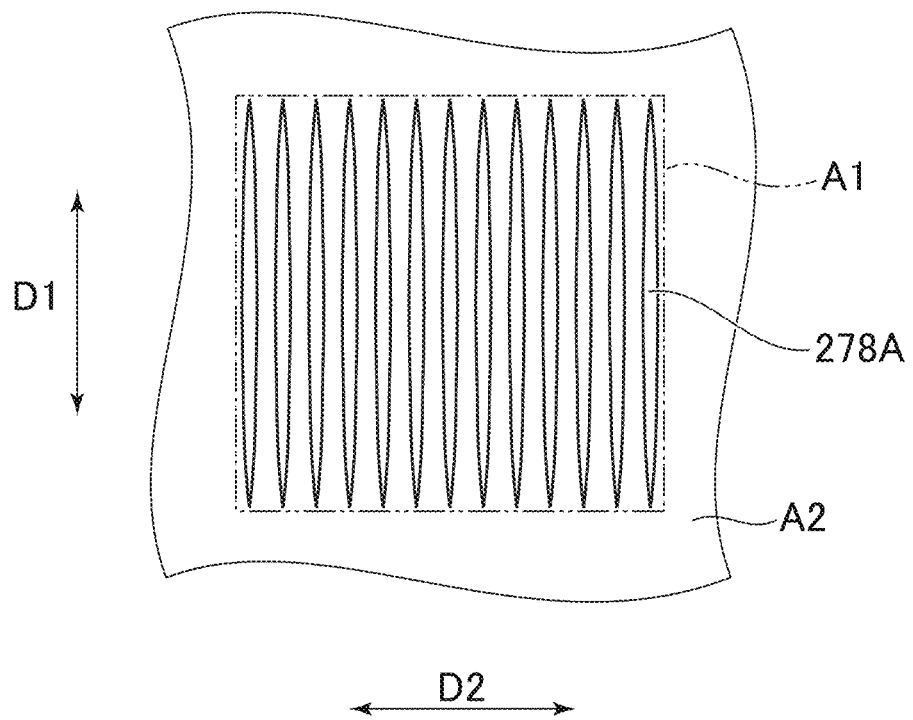
FIG. 14 is a diagram illustrating a modification of the heat conductive sheet according to the second embodiment.

FIG. 14 is a diagram illustrating a modification of the heat conductive sheet according to the second embodiment. This modification differs from the example of FIG. 13 in that a plurality of light transmitting portions 278A are slits each extending in the first direction D1, and are arranged in the second direction D2.

The light transmitting portion 278A has a tapered width at both ends in the first direction D1. Therefore, the ratio of the plurality of light transmitting portions 278A occupying the first area A1 changes along one of the first direction D1 and the second direction D2 (the first direction D1 in this example). That is, the ratio of the plurality of light transmitting portions 278A occupying the first area A1 is smaller as the position is closer to the second area A2 in the first direction D1. Conversely, the ratio of a plurality of heat conducting portions 280A occupying the first area A1 increases as the position is closer to the second area A2 in the first direction D1.

Third Embodiment

Figure 15:
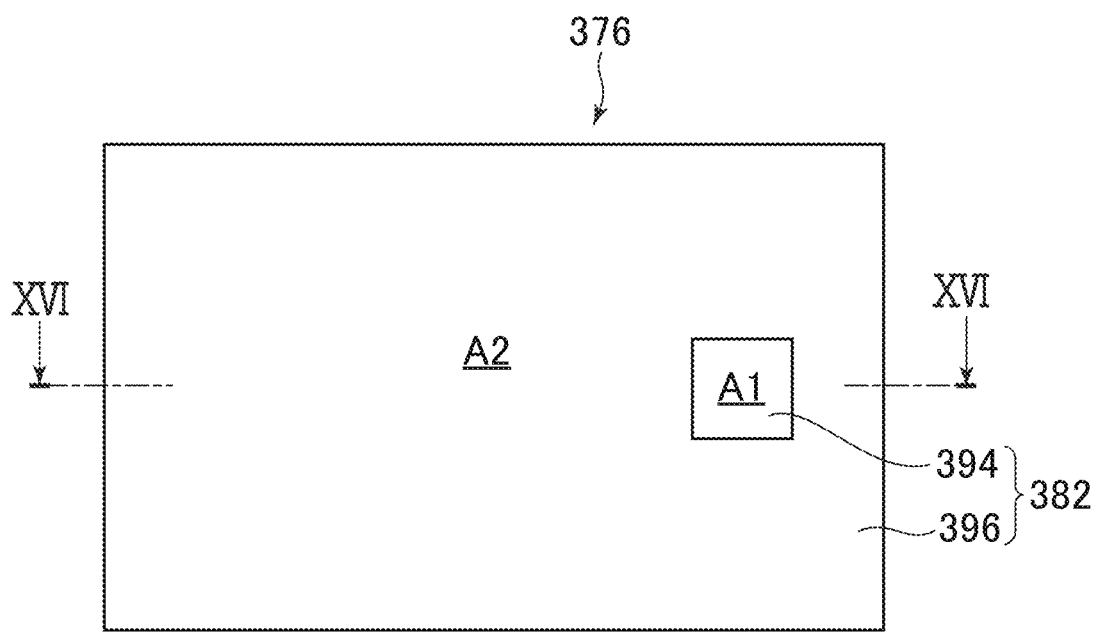
FIG. 15 is a rear view illustrating a heat conductive sheet according to a third embodiment to which the present invention is applied.
Figure 16:
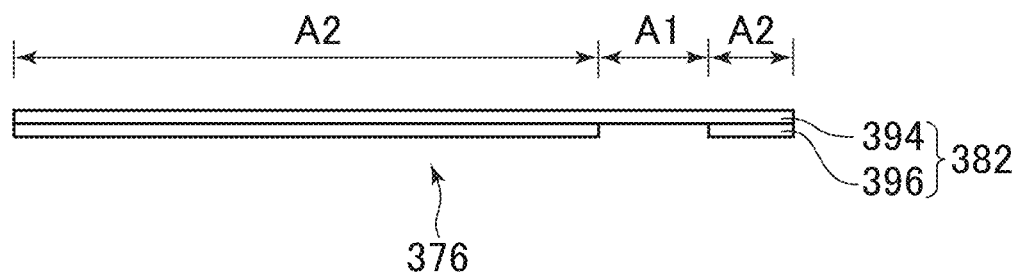
FIG. 16 is a cross-sectional view taken along line XVI-XVI of the heat conductive sheet shown in FIG. 15.

FIG. 15 is a rear view illustrating a heat conductive sheet according to a third embodiment to which the present invention is applied. FIG. 16 is a cross-sectional view taken along line XVI-XVI of the heat conductive sheet shown in FIG. 15. A heat conductive sheet 376 includes a heat conductive layer 382. The heat conductive layer 382 includes a first heat conductive layer 394. The first heat conductive layer 394 has a thickness with light transmittance. The first area A1 is constituted of the first heat conductive layer 394. Thus, the heat conductive sheet 376 is entirely made of a heat conductive material at a thickness having light transmittance in the first area A1.

The heat conductive layer 382 includes a second heat conductive layer 396. The second heat conductive layer 396 has a higher heat conductivity than the heat conductive layer 382 and has no light transmittance. The second heat conductive layer 396 is stacked on the first heat conductive layer 394 in the second area A2 avoiding the first area A1. That is, the second area A2 is constituted of the first heat conductive layer 394 and the second heat conductive layer 396.

Fourth Embodiment

Figure 17:
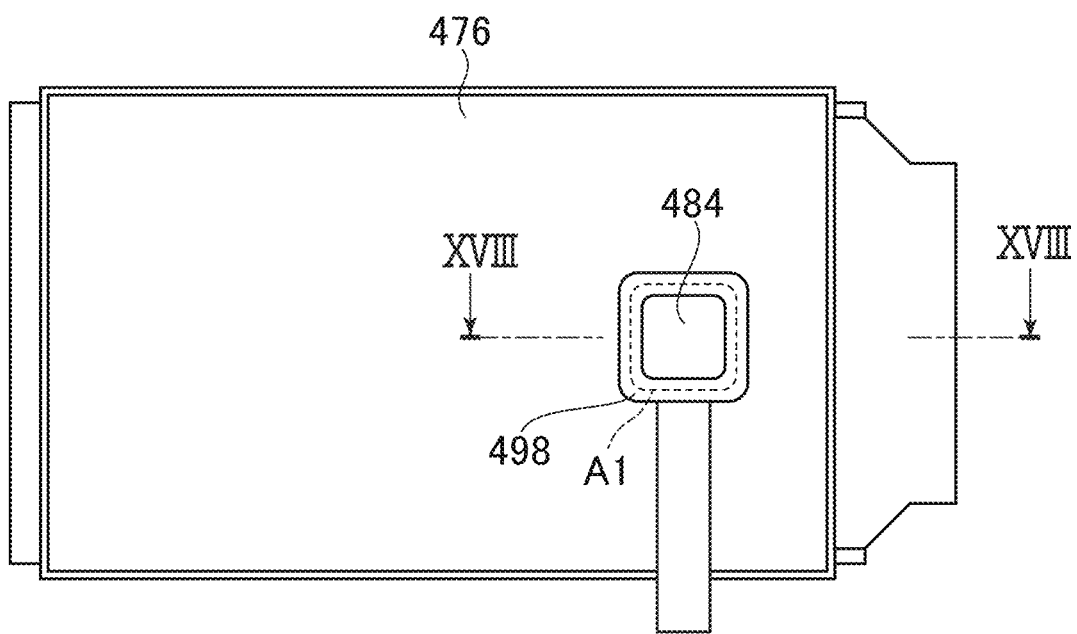
FIG. 17 is a rear view illustrating a display device according to a fourth embodiment to which the present invention is applied.
Figure 18:
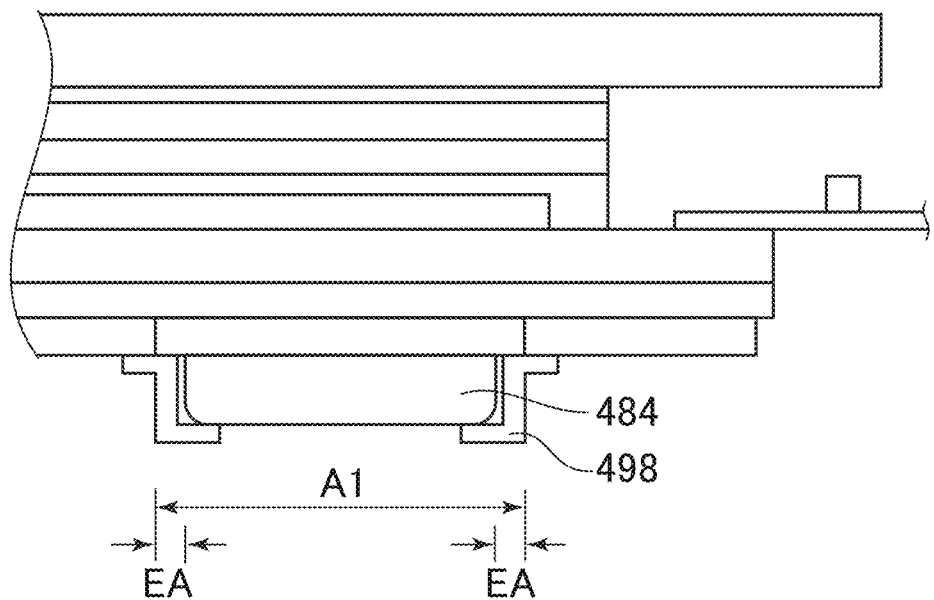
FIG. 18 is a cross-sectional view taken along line XVIII-XVIII of the display device shown in FIG. 17.

FIG. 17 is a rear view illustrating a display device according to a fourth embodiment to which the present invention is applied. FIG. 18 is a cross-sectional view taken along line XVIII-XVIII of the display device shown in FIG. 17. In the present embodiment, the first area A1 of a heat conductive sheet 476 includes a surplus area EA protruding from an optical fingerprint sensor 484. That is, the first area A1 is larger than the optical fingerprint sensor 484. Therefore, in order to prevent external light from entering, a light-blocking shield 498 covers the surplus area EA. The light-blocking shield 498 may be provided by applying a color gel such as black, or may be provided by attaching a light-blocking seal.

The display device is not limited to the organic electroluminescence display device, and may be a display device including a light emitting element such as a quantum-dot light emitting diode (QLED) in each pixel.

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
a display circuit layer including a first surface and a second surface and including a display area in which an image is displayed on the first surface;
a heat conductive sheet overlapping the display circuit layer below the second surface; and
an optical fingerprint sensor inside the display area below the heat conductive sheet and overlapping the display circuit layer, wherein
the heat conductive sheet includes a first area overlapping the optical fingerprint sensor, and a second area overlapping the display area around the optical fingerprint sensor,
the heat conductive sheet includes a heat conductive material, has a shape having light transmittance required for sensing by the optical fingerprint sensor in the first area, and has no light transmittance in the second area,
the first area includes a surplus area outside the optical fingerprint sensor in a plan view, and
a light-blocking shield covers the surplus area.

2. The display device according to claim 1, wherein
the heat conductive sheet includes, in the first area, a plurality of light transmitting portions formed of slits or holes and a plurality of heat conducting portions made of the heat conductive material so as to be integrated with each other continuously from the second area, which are alternately provided in at least one direction, and
the plurality of heat conducting portions do not have the light transmittance.

3. The display device according to claim 2, wherein
the ratio of the plurality of light transmitting portions occupying the first area changes along at least one of a first direction and a second direction orthogonal to each other.

4. The display device according to claim 2, wherein
the ratio of the plurality of light transmitting portions occupying the first area is smaller as the position is closer to the second area.

5. The display device according to claim 2, wherein
the ratio of the plurality of heat conducting portions occupying the first area increases as the position is closer to the second area.

6. The display device according to claim 1, wherein
the heat conductive sheet entirely includes the heat conductive material at a thickness having light transmittance in the first area.

7. The display device according to claim 1, wherein the heat conductive sheet includes a first heat conductive layer and a second heat conductive layer, the first heat conductive layer has the thickness having the light transmittance, the first area is constituted of the first heat conductive layer, and the second heat conductive layer has a higher heat conductivity than the heat conductive sheet, has no light transmittance, and is stacked on the first heat conductive layer in the second area avoiding the first area.

8. The display device according to claim 1, wherein
the heat conductive sheet includes an uppermost layer closest to the second surface and a base layer below the uppermost layer, and
the uppermost layer has a lower light reflectance than the base layer.

9. The display device according to claim 1, wherein
the display circuit layer includes a plurality of light emitting elements for displaying the image in the display area, and
the sensing by the optical fingerprint sensor is configured to use the reflection obtained by irradiating a sensing target with light from the plurality of light emitting elements.

10. The display device according to claim 1, wherein
the optical fingerprint sensor is mounted on the heat conductive sheet.

11. The display device according to claim 1, wherein
the second surface of the display circuit layer is an inorganic insulating surface, and
the heat conductive sheet is stacked on the inorganic insulating surface.

12. The display device according to claim 1, wherein
the second surface of the display circuit layer is an inorganic insulating surface,
an organic insulating film is further provided below the inorganic insulating surface, and
the heat conductive sheet is below the organic insulating film.

13. The display device according to claim 1, wherein
the second surface of the display circuit layer is an inorganic insulating surface,
a pair of organic insulating films are further provided below the inorganic insulating surface, and
the heat conductive sheet is interposed between the pair of organic insulating films.

14. The display device according to claim 1, wherein
the heat conductive sheet includes at least one selected from the group consisting of copper, chromium, and carbon or a compound thereof.

* * * * *